(12) United States Patent
Amamiya et al.

(10) Patent No.: US 8,628,986 B2
(45) Date of Patent: Jan. 14, 2014

(54) ORGANIC ELECTROLUMINESCENT ELEMENT AND METHOD FOR MANUFACTURING THE SAME

(75) Inventors: Satoshi Amamiya, Niihama (JP); Teruyuki Matsue, Ibaraki (JP); Yoshinobu Ono, Tsukubamirai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 603 days.

(21) Appl. No.: 12/670,563

(22) PCT Filed: Jul. 24, 2008

(86) PCT No.: PCT/JP2008/063286
§ 371 (c)(1),
(2), (4) Date: Jan. 25, 2010

(87) PCT Pub. No.: WO2009/017026
PCT Pub. Date: Feb. 5, 2009

(65) Prior Publication Data
US 2010/0193817 A1 Aug. 5, 2010

(30) Foreign Application Priority Data
Jul. 31, 2007 (JP) ................................. 2007-200100

(51) Int. Cl.
*H01L 51/52* (2006.01)

(52) U.S. Cl.
USPC .................. 438/29; 438/22; 438/46; 257/98; 257/E51.018

(58) Field of Classification Search
USPC .................. 438/29, 22, 46; 257/98, E51.018
See application file for complete search history.

(56) References Cited

U.S. PATENT DOCUMENTS

2003/0129790 A1   7/2003 Yamazaki et al.
2003/0137242 A1   7/2003 Seki
2003/0140982 A1   7/2003 Seki et al.
2007/0096637 A1   5/2007 Kim

FOREIGN PATENT DOCUMENTS

| JP | 2001-076874 A | 3/2001 |
|----|---------------|--------|
| JP | 2003-045668 A | 2/2003 |
| JP | 2003-332055 A | 11/2003 |
| JP | 2004-047410 A | 2/2004 |

(Continued)

OTHER PUBLICATIONS

Supplementary European Search Report dated Jul. 20, 2012 issued in a European Patent Application No. 08791538.5.

(Continued)

*Primary Examiner* — Long Pham
(74) *Attorney, Agent, or Firm* — Sughrue Mion, PLLC

(57) ABSTRACT

The present invention provides an organic electroluminescence (EL) element that suppresses leakage current flowing between an upper electrode and an under electrode through an organic layer. The organic EL element (51) is provided at a pixel region (R11) surrounded by a bank (3) on the substrate, and comprises: an organic layer (9) including at least one layer of the light-emitting layer (6); an upper electrode (7) and an under electrode (2) which hold the organic layer (9) therebetween; and a leakage current block layer (5) formed between the upper electrode (7) and the under electrode (2) at the boundary region (R12) between the pixel region (R11) and the bank region (R13), and formed between the upper electrode (7) and the under electrode (2) at the boundary region (R12) between the pixel region (R11) and the bank region (R13). The electric resistance of the leakage current block layer (5) in a thickness direction of the substrate is higher than the electric resistance of the organic layer (9) provided between the leakage current block layer (5) and the first electrode (2) in the thickness direction of the substrate.

16 Claims, 4 Drawing Sheets

(56) References Cited

FOREIGN PATENT DOCUMENTS

| | | |
|---|---|---|
| JP | 2004-55177 A | 2/2004 |
| JP | 2004-179028 A | 6/2004 |
| JP | 2005-166441 A | 6/2005 |
| JP | 2005-203215 A | 7/2005 |
| JP | 2006-260950 A | 9/2006 |
| JP | 2007-123068 A | 5/2007 |

OTHER PUBLICATIONS

T. Shimoda et al., "26.3: Multicolor Pixel Patterning of Light-Emitting Polymers by Ink-Jet Printing", Society for Information Display International Symposium Digest of Technical Papers, vol. XXX, May 18-20, 1999, pp. 376-379.

ORGANIC ELECTROLUMINESCENT ELEMENT AND METHOD FOR MANUFACTURING THE SAME

TECHNICAL FIELD

The present invention relates to an organic electroluminescence element (hereinafter, may be referred to as an organic EL element) and a method for manufacturing the organic EL element, and more particularly, to a structure for preventing leakage current from the organic EL element.

BACKGROUND ART

Organic EL elements are formed on substrates made of glass, plastic (including films), silicon wafers, or the like. Generally, organic EL elements have a stacked structure comprising a lower electrode, an upper electrode, and an organic layer disposed between the lower electrodes and the upper electrodes. The organic layer have a light-emitting layer made of light-emitting materials, as necessary, hole transport layers and/or electron transport layers and the like. When voltage is applied between the upper electrode and the lower electrode of the organic EL element to flow electric current, carriers (electrons and holes) injected from both electrodes are recombined in the light-emitting layers, which leads to light emission from the light-emitting layers.

In such organic EL elements, forming banks directly on the lower electrodes allows to enhance patterning accuracy of organic layers (ink). On the other hand, the thicknesses of the organic layers may become small at boundary portions between the banks and the lower electrodes due to repelling of ink droplets at the side surfaces of the banks. To avoid this problem, for example, Patent Document 1 refers a structure in which an inorganic insulating layer such as silicon oxide covering the periphery of a lower electrode is inserted between the lower electrode and a bank. In this method, because the inorganic insulating layer is formed by covering a boundary portion between the bank and the lower electrode, a dielectric strength voltage at the boundary portion between the bank and the lower electrode can be enhanced, which enables to suppress electric leak.

Patent Document 1: JP 2005-203215 A.

DISCLOSURE OF INVENTION

Problem to be Solved by the Invention

However, the method in Patent Document 1 requires to form the inorganic insulating layer generally by a process using a vacuum apparatus, such as a chemical vapor deposition (CVD) method and a sputtering method, prior to a process of forming an organic layer by an ink-jet method. Therefore, the method in Patent Document 1 has problems that a costly equipment investment is required and that its application to large screens is difficult. Furthermore, this method has another problem that the method does not effectively work on leakage current that flows through a hole injection layer as explained below.

FIG. 6 is a sectional view of a state in which leakage current flows through a hole injection layer of a conventional organic EL element. In an organic EL element 100 shown in FIG. 6, a plurality of lower electrodes 20 are formed on a glass substrate 10, and a bank 30 is provided between the neighboring lower electrodes 20 so as to surround each of the lower electrodes 20. The bank 30 is formed on the periphery of each of the neighboring lower electrodes 20. An organic layer 90 (a hole injection layer 40 and a light-emitting layer 60) is formed at an opening of the bank 30 by an ink-jet method. An upper electrode 70 is formed on the upper surfaces of the organic layer 90 and the bank 30.

As shown in FIG. 6, the organic layer 90 (the hole injection layer 40 and the light-emitting layer 60) creeps up the inclined surface of the bank 30 at a boundary region between the organic layer 90 and the bank 30. This creep-up portion is formed by reducing the liquid repellency of a bank. The creep-up portion refers to a portion of a film formed into such a shape creeping up an inclined surface through film formation. The resistivity of the hole injection layer 40 is not so high compared with the resistivity of the light-emitting layer 60 or the like. As a result, as shown in FIG. 6 with an arrow C, leakage current may flow between an upper electrode 70 and the lower electrodes 20. The above method, that is, a method that inserts an inorganic insulating layer such as silicon oxide covering the periphery of a lower electrode between the lower electrode and a bank is not effective for leakage current that flows in such a pathway.

In view of the foregoing, the present invention has been made, and it is an object of the present invention to provide an organic EL element that suppresses leakage current flowing between an upper electrode and a lower electrode through an organic layer at a boundary region between a pixel region and a bank region, and a method for producing the organic EL element.

Means for Solving Problem

The present invention provides an organic EL device that employs the following structure and a method for producing the device.

[1] An organic electroluminescence element comprising:
  a first electrode provided near to a substrate;
  a second electrode provided at the side of the first electrode opposite to the substrate, and paired with the first electrode;
  an organic layer held between the first electrode and the second electrode, and comprising at least one light-emitting layer;
  a leakage current block layer formed between the first electrode and the second electrode and at a boundary region between the organic layer and a bank,
  wherein an electric resistance of the leakage current block layer in a thickness direction of the substrate is higher than an electric resistance of the organic layer lying between the leakage current block layer and the first electrode in the thickness direction of the substrate; and
  being at a pixel region surrounded by the bank provided on the substrate.

[2] The organic electroluminescence element according to the above [1], wherein the leakage current block layer is formed by an ink-jet method.

[3] The organic electroluminescence element according to the above [1] or [2], wherein the boundary region viewed from the thickness direction of the substrate has a substantially elliptical shape which has two straight portions that are substantially linear and face substantially parallel to each other, and the leakage current block layer is formed at curved portions which is at except the two straight portions from the boundary region.

[4] The organic electroluminescence element according to any one of the above [1] to [3], wherein the organic layer has a hole injection layer;

the hole injection layer is formed by an ink-jet method configured to form a creep-up portion along an inclined surface of the bank;

and the leakage current block layer is provided between the creep-up portion of the hole injection layer and the second electrode.

[5] The organic electroluminescence element according to any one of the above [1] to [3], wherein the light-emitting layer is formed by an ink-jet method configured to form a creep-up portion along an inclined surface of the bank, and the leakage current block layer is provided between the creep-up portion of the light-emitting layer and the second electrode.

[6] The organic electroluminescence element according to any one of the above [1] to [5], wherein the width of the leakage current block layer in a direction from the bank to the center of the pixel region viewed from the thickness direction of the substrate is 1 micrometer or more to 10 micrometers or less.

[7] The organic electroluminescence element according to any one of the above [1] to [5], wherein the leakage current block layer has a resistivity of $10^6$ or more ohm centimeters.

[8] The organic electroluminescence element according to any one of the above [1] to [5], wherein the leakage current block layer is a polymer resin crosslinked with heat or light.

[9] A method for producing an organic electroluminescence element, which has a first electrode provided near to a substrate, a second electrode provided at the side of the first electrode opposite to the substrate and paired with the first electrode, and an organic layer held between the first electrode and the second electrode and comprising at least one light-emitting layer, and which is at a pixel region surrounded by a bank provided on a substrate, the method comprising:

discharging an organic material in the pixel region by an ink-jet method and forming a leakage current block layer between the first electrode and the second electrode, at a boundary region between the organic layer and the bank, so that electric resistance of the leakage current block layer in a thickness direction of the substrate is higher than an electric resistance of the organic layer sandwiched with the first electrode in the thickness direction of the substrate.

[10] The method for producing an organic electroluminescence element according to the above [9], wherein at the forming the leakage current block layer, the leakage current block layer is stacked on a surface of a hole injection layer at the boundary region between the organic layer and the bank by making the organic material creep up along an inclined surface of the hole injection layer utilizing a property of the organic material that is repelled from the hole injection layer comprised in the organic layer.

[11] The method for producing an organic electroluminescence element according to the above [9], wherein at the forming the leakage current block layer, an edge of the leakage current block layer is formed on an inclined surface of the hole injection layer formed at an inner peripheral side surface of the pixel region, by dropping a droplet containing the organic material at the boundary region or the pixel region.

[12] The method for producing an organic electroluminescence element according to the above [9], wherein at the forming the leakage current block layer, the leakage current block layer is formed on a surface of the light-emitting layer at the boundary region between the organic layer and the bank by making the organic material creep up along an inclined surface of the light-emitting layer utilizing a property of the organic material that is repelled from the light-emitting layer comprising in the organic layer.

[13] The method for producing an organic electroluminescence element according to the above [9], wherein at the forming the leakage current block layer, an edge of the leakage current block layer is formed on an inclined surface of the light-emitting layer formed at an inner peripheral side surface of the pixel region, by dropping a droplet containing the organic material at the boundary region or the pixel region.

[14] The method for producing an organic electroluminescence element according to any one of the above [9] to [13], wherein the forming the leakage current block layer comprises discharging ink in which an organic solvent as the organic material is contained as a main component by the ink-jet method, and thereafter crosslinking the ink by heat and/or light, thereby forming the leakage current block layer.

[15] The method for producing an organic electroluminescence element according to any one of the above [9] to [14], wherein the organic layer comprises the hole injection layer and the hole injection layer is formed by the ink-jet method.

[14] The method for producing an organic electroluminescence element according to any one of the above [9] to [15], wherein the light-emitting layer is formed by the ink-jet method.

EFFECT OF THE INVENTION

The organic EL element of the present invention performs an effect that surely suppresses leakage current flowing between the first electrode and the second electrode through the organic layer at the boundary region since it has a leakage current block layer that is formed from an organic material having a higher resistance than that of an organic layer and is formed between a first electrode and a second electrode at a boundary region between a pixel region and a bank region.

According to the method for producing the organic EL element of the present invention, it is possible to form the leakage current block layer easily and properly since the leakage current block layer is formed by discharging an organic material having a higher resistance than that of an organic layer by an ink-jet method.

EXPLANATIONS OF LETTERS OR NUMERALS

Figure 1:
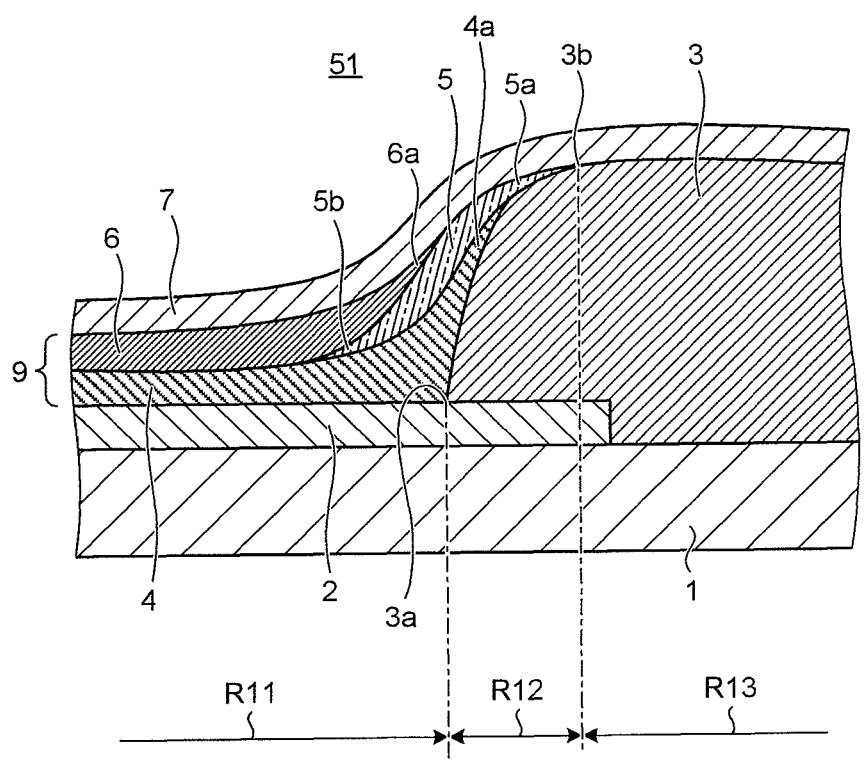
FIG. 1 is a sectional view in the direction of arrows A-A of FIG. 2 of a portion of a pixel region of the first embodiment of the organic EL element according to the present invention.

1 Glass substrate (substrate)
2 Lower electrode (first electrode)
3 Bank
4 Hole injection layer
5, 5B, 5C Leakage current block layer
6 Light-emitting layer
7 Upper electrode (second electrode)
9 Organic layer
11, 11B Pixel region
12, 12B Boundary region
13 Bank region
51, 52, 53 Organic EL element

BEST MODES FOR CARRYING OUT THE INVENTION

Referring to drawings, embodiments of the present invention will further be explained in detail. To facilitate understanding, a scale of each member in drawings may be different from its actual scale. The present invention is not limited by the following description. Changes and modifications may be made appropriately without departing from the spirit and scope of the present invention. Although an organic EL device has members such as a lead for an electrode, the description for such members is omitted because the members are not directly needed to explain the present invention. For convenience to explain a layer structure and the like, examples shown below will be explained with drawings in which a substrate is arranged at the bottom. However the organic EL element according to the present invention and the organic EL device having the organic EL element mounted thereon are not necessary to be placed in line with the up-down or right-left orientation shown in the drawings for producing or using, and the orientation may be appropriately adjusted.

First Embodiment

Figure 2:
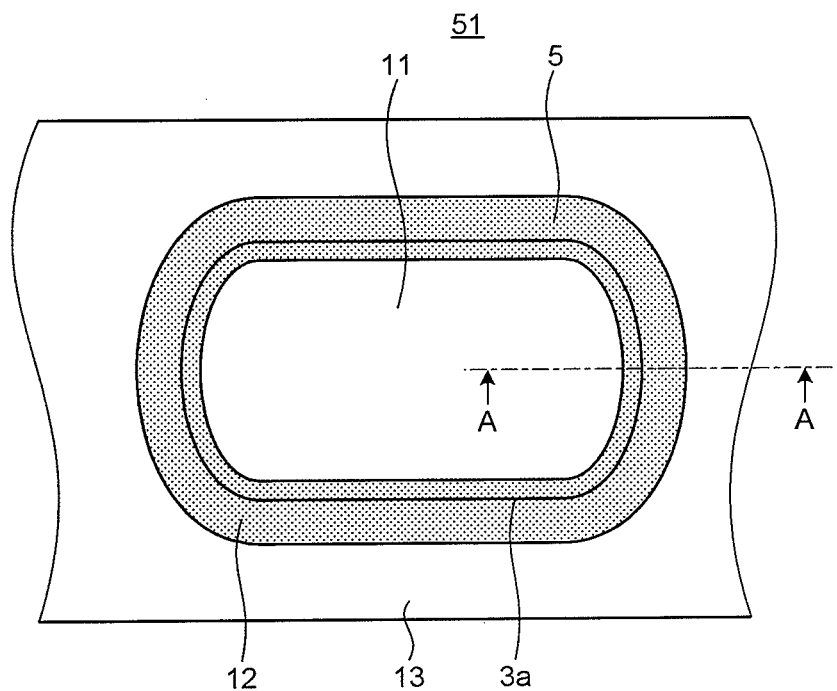
FIG. 2 is a diagram of the pixel region of the organic EL element viewed from the opening side of the concave portion of the element.

FIG. 1 is a sectional view in the direction of arrows A-A of FIG. 2, which depicts a part of a pixel region of the first embodiment of an organic EL element according to the present invention. FIG. 2 is a diagram of the pixel region of the organic EL element viewed from the opening side of the concave portion of the element. As shown in FIGS. 1 and 2, in the structure of the organic EL element 51 of the present embodiment, the lower electrode 2 is formed as a first electrode in a assigned region that is on a first surface (upper surface) of the glass substrate 1 including the pixel region R11. The bank 3 is provided between the neighboring lower electrodes 2 so as to surround each of the lower electrodes 2. The bank 3 is thickly formed on the periphery of each of the neighboring lower electrodes 2. The bank 3 formed in this way provides a concave portion of which the bottom is composed of the lower electrodes 2 at the position of the pixel region R11.

As shown in FIG. 2, the concave portion formed with the bank 3 has a substantially oval shape (elliptical shape) when viewing the first surface from above. In the concave portion, a region with no bank 3 provided on the lower electrode 2 takes the form of the pixel region R11. The concave portion formed with the bank 3 has a shape that is inclined to be broadened at the periphery of the pixel region R11, to form an inclined surface. In other words, the concave portion formed with the bank 3 is formed so that the opening of the concave portion is broadened as the concave portion is apart from the substrate 1. A region of the inclined surface ranging from the periphery of the pixel region R11 including the lower end point 3a of the bank to the point 3b at the highest position of the inclined surface takes the form of a boundary region R12. The boundary region R12 forms a boundary between the bank region R13 extending around the boundary region R12 and the pixel region R11. Although the width of the boundary region R12 in a substrate direction is not particularly limited, from the viewpoint of a cost, it is preferably equal to or more than one micrometer and equal to or less than 10 micrometers.

Each layer formed in the concave portion formed with the bank 3 in the pixel region is explained in the order of steps of forming the layers. The hole injection layer 4 is formed at the first surface of the lower electrode 2. The hole injection layer 4 has a function that improves the hole injection efficiency from the lower electrode 2, and is formed by an ink-jet method. By influence of liquid surface tension, the hole injection layer 4 is formed so that the periphery thereof creeps up the inclined surface of the bank 3.

The ink-jet method is a method that ink is adhered on a printing object by discharging particles of ink or a droplet from a spray nozzle. Because the ink is discharged by the ink-jet method, generally, a solution with considerably lower viscosity than that of ink used for printing such as flexographic printing is used for the ink. For the ink adhered on the printing object, the solvent in the ink is distilled away by natural drying or the like. As the result, coloring components contained in the ink as a solvent are then fixed on the printing object. In modes of the layer forming method (or the film forming method) that applies a low viscosity solution, such as the ink-jet method, a step of natural drying, or a step of drying with heat may be provided after the ink is adhered on the printing object.

The leakage current block layer 5 is provided between the first electrode and the second electrode and at a boundary region R12 between the organic layer and a bank. In the present embodiment, the electric resistance of the leakage current block layer 5 in the thickness direction of the substrate is higher than the electric resistance of the organic layer 9 provided between the leakage current block layer 5 and the lower electrode 2, that is, the electric resistance of the hole injection layer 4 in the thickness direction of the substrate. According to the present embodiment, the leakage current block layer 5 is formed on the first surface (upper surface) of the hole injection layer 4 (a step for forming a block layer). The leakage current block layer 5 is also formed by the ink-jet method. By utilizing a property that the leakage current block layer 5 is repelled by the hole injection layer 4 formed thereunder, the leakage current block layer 5 is formed on the first surface of the hole injection layer 4 at the boundary region R12 by making the leakage current block layer 5 creep up the inclined surface of the hole injection layer 4 formed at the inner peripheral side surface of the pixel region R11. A creep-up portion 5a of the leak current block layer 5 creeps up to reach a higher position than the inclined surface formed with a creep-up portion 4a of the hole injection layer 4, so as to totally cover the creep-up portion 4a of the hole injection layer 4. The lower end 5b of the leakage current block layer 5 is also repelled by the hole injection layer 4 and backs off to the position near outer periphery of the pixel region R11.

The light-emitting layer 6 having a light emitting function is further formed on the first surface of the hole injection layer 4. The light-emitting layer 6 is also formed so as to creep up the inclined surface of the leakage current block layer 5 by influence of surface tension. However, the creep-up portion 6a does not reach the position which covers the edge of the leakage current block layer 5. The upper electrode 7 as a second electrode is formed on a first surface of the light-emitting layer 6 as the top positioned layer.

At the step of forming the block layer, the leak current block layer 5 is formed by: discharging ink containing an organic solvent and a polymer resin that is a high resistance organic material as main components by the ink-jet method; and crosslinking the ink with heat and/or light. At this time, the viscosity of the high resistance organic material is adjusted to make the leakage current block layer 5 stay at the predetermined position until the step of drying after the ink is discharged.

According to the present embodiment, as described above, the leakage current block layer 5 is formed between the hole injection layer 4 and the upper electrode 7 so as to cover the creep-up portion 4a of the hole injection layer 4 at the boundary region R12. The resistance of the leakage current block layer 5 is higher than the resistances of the hole injection layer 4 and the light-emitting layer 6. The leakage current block layer 5 has a high resistance rate that is preferably $10^6$ or more ohm centimeters, and more preferably $10^{14}$ or more ohm centimeters, preventing current flowing from the upper electrode 7 to the lower electrode 2 through the hole injection layer 4. Since the leakage current block layer 5 is formed by a simple process step that is the ink-jet method, image quality is considerably improved at low cost.

The leakage current block layer 5 used in the present invention contains an organic material having a higher resistance than the resistance of the whole organic layer between the leakage current block layer 5 and the lower electrode 2. Examples of the organic material may include: a polymer compound obtained by crosslinking a polymer having a crosslinking group by treatment such as heating or light irradiating; and a polymer compound obtained by mixing a polymer and a crosslinking agent and crosslinking them by treatment such as heating or light irradiating.

According to the present embodiment as described above, the leakage current block layer 5 is formed by the ink-jet method in the same manner as the hole injection layer 4 and the light-emitting layer 6. One method of forming the leakage current block layer 5 is that: the ink is repelled on the hole injection layer 4 and creeps up the inclined surface of the hole injection layer 4 that is formed at the periphery of the pixel region R11 to reach the predetermined position. Therefore, the viscosity of the ink containing the high resistance organic material when spraying the material by the ink-jet method is a considerable factor. When the viscosity is too large or too small, the leakage current block layer 5 cannot be formed at a proper position. Optimal viscosity is selected by considering the repelling ability to a lower layer (the hole injection layer 4 according to the present embodiment).

Another method of forming the leakage current block layer 5 is that: under adjusting various conditions such as the liquid repellency of the surface of the bank to ink for a leakage current block layer, the surface tension of ink, the inclination angle of the bank, and the liquid amount of the ink, an ink droplet is dropped at the boundary region or the inside of the pixel region, and the edge of the leakage current block layer is spontaneously arranged on the inclined surface of the bank through a process of evaporating or drying the droplet, and thus the creep-up portion has been formed. Especially, the viscosity of the ink containing the high resistance organic material at the time of spraying the ink by the ink-jet method is a considerable factor. By properly adjusting the viscosity not to be too large or too small, the leakage current block layer 5 can be formed at a proper position.

The organic layer 9 of the present embodiment is composed of the hole injection layer 4 and the light-emitting layer 6, but it is not limited thereto. The organic layer 9 may further include other layers.

According to the present embodiment, the current that leaks through the hole injection layer 4 is designated as the object to be suppressed. However, the formation may be changed so that current that leaks through other layer of the organic layers can be designated as an object to be suppressed. In this case, a leakage current block layer may be formed so as to block the leakage of the current designated as the object, which can be achieved by properly adjusting the viscosity of an organic material making up the leakage current block layer.

Thus, the organic layer 9 may include layers other than the organic light-emitting layer. Specific examples of the layer may include a hole injection layer containing an organic compound, a hole transport layer containing an organic compound, an electron injection layer containing an organic compound, an electron transport layer containing an organic compound, a hole block layer containing an organic compound, and an electron block layer containing an organic compound. The organic layer 9 may be provided directly on the anode 2(lower electrode), or may be provided over the anode 2 (lower electrode) via other layers. Examples of the other layers provided between the anode 2(lower electrode) and the organic layer may include a hole injection layer made of an inorganic compound and an electron injection layer made of an inorganic compound.

Figure 5:
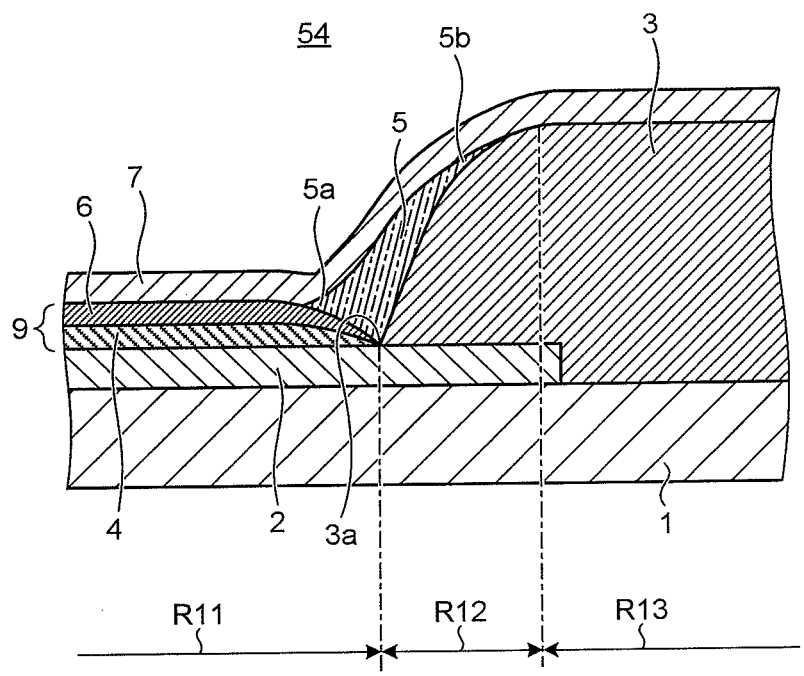
FIG. 5 is a sectional view of a portion of a pixel region of the fourth embodiment according to the present invention.
Figure 6:
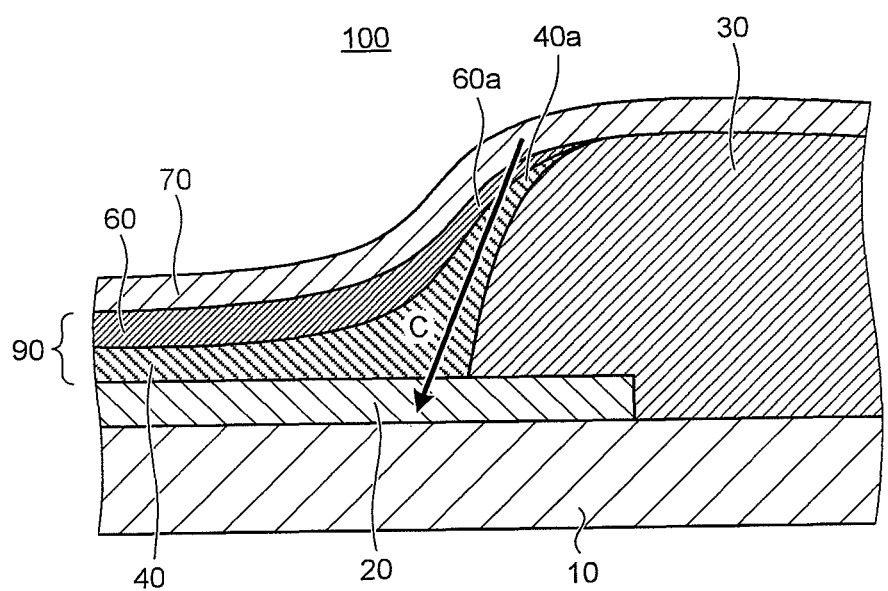
FIG. 6 is a sectional view of a state in which leakage current flows through a hole injection layer of a conventional organic EL element.

Another embodiment, which is the fourth embodiment, is shown in FIG. 5. In FIG. 5, an example is shown where the liquid repellency of the bank 3 to the ink for an organic layer is higher than that shown in FIG. 1. The layer thickness of the organic layer 9 at a contact portion with the bank 3 is enormously reduced due to the liquid repellency of the bank 3. Even in such a case, according to the method of the present invention, the leakage current can be reduced by forming the leakage current block layer 6 at least at the boundary region R12. When the organic layer 9 (the hole injection layer 4 and the light-emitting layer 6) is formed, the liquid repellency on the surface of the bank 3 is reduced properly by performing a lyophilic treatment, and then an ink droplet for a leakage current block layer is discharged in the inside region of the boundary region R12 or the pixel region R11 by the ink-jet method. At a step of evaporating or drying the discharged droplet, the edge of the leakage current block layer 6 is spontaneously arranged on the inclined surface of the bank. As the result of forming the leakage current block layer 5 on the inclined surface of the bank by such a method, the leakage current block layer 5 covers at least the whole of the boundary region R12, and is formed over from the edge 5b near the partition region R13 to the another edge 5a so as to cover a part of the pixel region R11. By providing the leakage current block layer 5 in such a range, an area where the film thickness of the organic layer 9 is extremely thin is sufficiently covered; thus, the leakage current block layer 5 serves its function more effectively. According to this method, leakage current can be prevented without forming an inorganic insulating film by a process using an expensive vacuum apparatus like in a conventional method, such as a chemical vapor deposition (CVD) method or a sputtering method.

As a method for the lyophilic treatment on the surface of the bank, an ultraviolet (UV) treatment, a UV-ozone treatment, and an oxygen plasma treatment may be included. In a processing method using a UV ray, the UV ray may be irradiated only at the boundary region using a mask.

The present embodiment has a structure in which the organic EL element 51 is formed configured to build up the anode 2(lower electrode), the organic EL layer 9(organic layer) including a light-emitting layer, and the cathode 7(upper electrode) on the substrate 1 in this order, and a sealing layer (not shown in the Figures) is formed so as to cover the whole of the organic EL element 51 formed on the substrate 1.

As the substrate 1, various substrates such as a glass substrate, a silicon substrate, and a plastic substrate may be used. As the anode 2, a metallic oxide film, a translucent metallic thin film, or the like having conductivity with a comparatively large work function—a work function is preferably 4.0 or more electron volts—is generally used. Specific examples of the film using for the anode 2 may include: metallic oxide such as indium tin oxide (hereinafter referred to as ITO), tin oxide; metal such as gold (Au), platinum (Pt), silver (Ag), and copper (Cu) or an alloy containing at least one of them; and an organic transparent conductive film such as polyaniline or derivatives thereof, and polythiophene or derivatives thereof. The anode 2 may be formed in a layer structure having two or more of layers, if necessary. The film thickness of the anode 2 may be selected appropriately in view of electric conductivity (if in the case of a bottom emission type, an optical transparency may be considered as well). For example, the film thickness is 10 nanometers to 10 micrometers, preferably, 20 nanometers to 1 micrometer, more preferably, 50 nanometers to 500 nanometers. Examples of methods for preparation of the anode 2 may include a vacuum deposition method, a sputtering method, an ion plating method, and a plating method. In the case of a top emission type, a reflective film for reflecting light beamed to the substrate side may be provided under the anode 2.

The organic EL layer 9 of the present embodiment has at least a light-emitting layer made from an organic substance. The light-emitting layer contains the organic substance (a small compound or a large compound) that emits fluorescence or phosphorescence. The light-emitting layer may further contain a dopant material. As the organic substance, pigment materials, metal complex materials, polymer materials, or the like may be included. The dopant material is a material doped in an organic substance as necessary, for the purpose such as improving the luminance efficiency of the organic substance and changing a luminescence wavelength. The thickness of the light-emitting layer made from an organic substance and the dopant doped as necessary is generally 20 angstroms to 2,000 angstroms.

(Pigment Material)

Examples of the pigment material may include cyclopendamine derivatives, tetraphenyl butadiene derivative compounds, triphenyl amine derivatives, oxadiazol derivatives, pyrazoloquinoline derivatives, distyrylbenzene derivatives, distyrylarylene derivatives, pyrrole derivatives, thiophene ring compounds, pyridine ring compounds, pelynone derivatives, pelylene derivatives, oligothiophene derivatives, trifumanyl amine derivatives, oxadiazol dimmer, and pyrazoline dimmer.

(Metal Complex Material)

Examples of metal complex materials may include metal complexes emitting from the triplet excited state such as iridium complexes and platinum complexes; and metal complexes such as aluminum quinolinol complexes, benzoquinolinol beryllium complexes, benzoxazolyl zinc complexes, benzothiazole zinc complexes, azomethyl zinc complexes, porphyrin zinc complexes, and europium complexes, which are complexes having aluminum (Al), zinc (Zn), beryllium (Be), or rare-earth metals such as terbium (Tb), europium (Eu), and dysprosium (Dy) as the central metal and having oxadiazole, thiadiazole, phenylpyridine, phenylbenzoimidazole, or quinoline structure as the ligand.

(Polymer Material)

Examples of the polymer material may include polyparaphenylene vinylene derivatives, polythiophene derivatives, polyparaphenylene derivatives, polysilane derivatives, polyacetylene derivatives, polyfluorene derivatives, polyvinyl carbazole derivatives, and polymer materials polymerized from the pigments or the metal complex light emitting materials mentioned above.

Among the above luminescent materials, examples of the material that emits blue light may include: distyrylarylene derivatives, oxadiazol derivatives, and polymers thereof; polyvinyl carbazole derivatives; polyparaphenylene derivatives; polyfluorene derivative; quinacridone derivatives; and coumarin derivatives. Particularly, polymer materials such as a polyvinyl carbazole derivative, polyparaphenylene derivatives, and polyfluorene derivatives are preferred.

Examples of the material that emits green light may include: quinacridone derivatives, coumarin derivatives, and polymers thereof; polyparaphenylene vinylene derivatives; and polyfluorene derivatives. Particularly, polymer materials such as polyparaphenylene vinylene derivatives and a polyfluorene derivatives are preferred.

Examples of the material that emits red light may include: coumarin derivatives, thiophene ring compounds, and polymers thereof; polyparaphenylene vinylene derivatives; polythiophene derivatives; and polyfluorene derivatives. Particularly, the polymer materials such as a polyparaphenylene vinylene derivatives, polythiophene derivatives and polyfluorene derivatives are preferred.

(Dopant Material)

Examples of the dopant materials may include pelylene derivatives, coumarin derivatives, rubrene derivatives, quinacridone derivatives, squarylium derivatives, porphyrin derivatives, styryl pigments, tetracene derivatives, pyrazolone derivatives, decacyclene, and phenoxazon.

The organic EL layer 9 may have layers other than the light-emitting layer, such as a layer provided between the light-emitting layer 6 and the anode 2; and a layer provided between the light-emitting layer 6 and the cathode 7 as necessary. Examples of the layer provided between the light-emitting layer and the anode 2 may include: a hole injection layer that improves hole injection efficiency from the anode 2; and a hole transport layer that improves hole injection from the anode 2, the hole injection layer or the hole transport layer closer to the anode 2 to the light-emitting layer. Examples of the layer provided between the light-emitting layer and the cathode 7 may include: an electron injection layer that improves electron injection efficiency from the cathode 7; and an electron transport layer that has a function to improve electron injection from the cathode 7, the electron injection layer, or the electron transport layer closer to the cathode 7.

(Hole Injection Layer)

Examples of a material that forms the hole injection layer may include: phenylamines; starburst-type amines; phthalocyanines; oxide such as vanadium oxide, molybdenum oxide, ruthenium oxide, and aluminum oxide; amorphous carbon; polyaniline; and polythiophene derivatives.

(Hole Transport Layer)

Examples of materials that forms the hole transport layer may include: polyvinyl carbazole or derivatives thereof; polysilane or derivatives thereof; polysiloxane derivatives having an aromatic amine at a side chain or a main chain thereof; pyrazoline derivatives; arylamine derivatives; stilbene derivatives; triphenyldiamine derivatives; polyaniline or derivatives thereof; polythiophene or derivatives thereof; polyarylamine or derivatives thereof; polypyrrole or derivatives thereof; poly(p-phenylenevinylene) or derivatives thereof; or poly(2,5-thienylene vinylene) and derivatives thereof.

When a hole injection layer or a hole transport layer has a function that interrupts electron transport, such a hole injection layer or a hole transport layer may be referred to as an electron block layer.

(Electron Transport Layer)

As materials that form the electron transport layer, a publicly know material may be used and those examples may include oxadiazol or derivatives thereof, anthraquinodimethane or derivatives thereof, benzoquinone or derivatives thereof, naphthoquinone or derivatives thereof, anthraquinone or derivatives thereof, tetracyanoanthraquinonedimethane or derivatives thereof, fluorenone or derivatives thereof, diphenyldicyanoethylene or derivatives thereof, diphenoquinone or derivatives thereof, 8-hydroxyquinoline or metal complexes of its derivatives, polyquinoline or derivatives thereof, polyquinoxaline or derivatives thereof, and polyfluorene or derivatives thereof.

(Electron Injection Layer)

As the electron injection layer, according to a type of the light-emitting layer, an electron injection layer may be provided as a single layer structure of a calcium (Ca) layer; or an electron injection layer consisting of a stacked structure that is composed of a Ca layer and a layer formed of any one or two or more types of metals in groups IA and IIA of the periodic table except Ca and having a work function of 1.5 to 3.0 electron volts, and oxide, halide, and carbonate of the above mentioned metals. Examples of the metals in the group IA of the periodic table and having a work function of 1.5 to 3.0 electron volts, or oxide, halide, or carbonate of those metals may include: lithium, lithium fluoride, sodium oxide, lithium oxide, and lithium carbonate. Examples of the metals in the group IIA of the periodic table except for Ca and having a work function of 1.5 to 3.0 electron volts, or oxide, halide, or carbonate of those metals may include: strontium, magnesium oxide, magnesium fluoride, strontium fluoride, barium fluoride, strontium oxide, and magnesium carbonate.

When an electron transport layer or an electron injection layer has a function that interrupts a hole transport, such an electron transport layer or such an electron injection layer may be referred to as a hole block layer.

As the cathode 7, transparent materials or translucent materials that have a comparatively small work function—a work function is preferably 4.0 or more electron volts—and easily injecting electrons into the light-emitting layer are preferred. The examples used for the cathode 7 may include: metals such as lithium (Li), sodium (Na), potassium (K), rubidium (Rb), cesium (Cs), Be, magnesium (Mg), calcium Ca, strontium (Sr), Barium (Ba), Al, scandium (Sc), vanadium (V), Zn, yttrium (Y), indium (In), cerium (Ce), samarium (Sm), Eu, Tb, and ytterbium (Yb); alloys of two or more of those metals; alloys of one or more of those metals and with one or more of Au, Ag, Pt, Cu, manganese (Mn), titanium (Ti), cobalt (Co), nickel (Ni), tungsten (W), and tin (Sn); or graphite or graphite interlayered-compounds; and metal oxide such as ITO and tin oxide.

The cathode 7 may have a stacked structure of two or more layers. Examples for this may include a structure of the above metals, the metal oxide, the fluoride, or alloys of these formed with metals such as Al, Ag, or chromium (Cr). The film thickness of the cathode 7 may be selected appropriately in view of electric conductivity and durability. For example, the film thickness is 10 nanometers to 10 micrometers, preferably, 20 nanometers to 1 micrometer, more preferably, 50 nanometers to 500 nanometers. For a method for preparation of the cathode 7, a vacuum deposition method, a sputtering method, a lamination method in which a metal thin film is thermocompressed, or the like, may be used.

The leakage current block layer used in the present embodiment may be formed between the upper electrode and a creep-up portion, which is formed configured to creep up the bank, of a layer such as the hole injection layer, the hole transport layer, the electron block layer, the light-emitting layer, the hole block layer, the electron transport layer, or electron injection layer.

Second Embodiment

Figure 3:
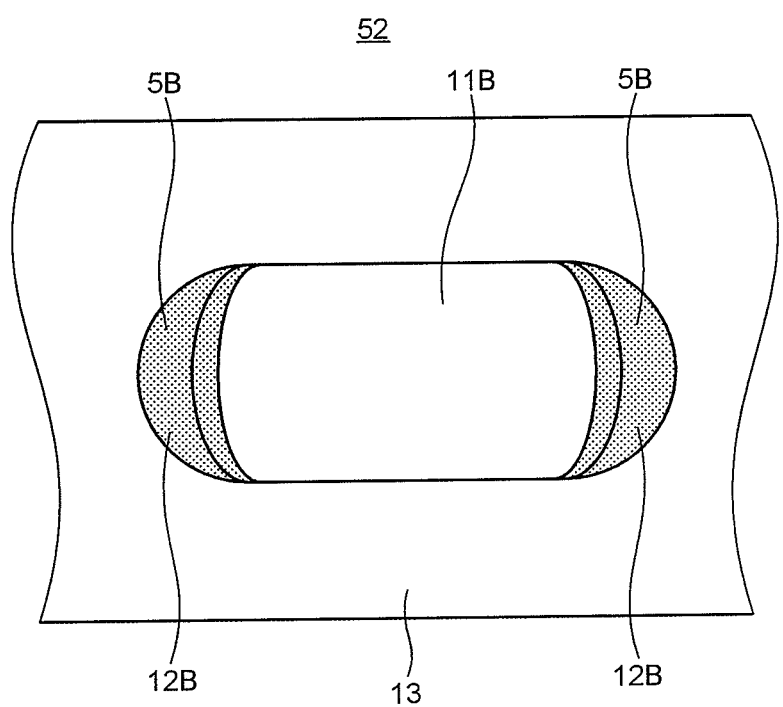
FIG. 3 is a diagram of a pixel region of the second embodiment of the organic EL element according to the present invention viewed from the opening side of a concave portion of the element.

FIG. 3 is the diagram of the pixel region of the second embodiment of the organic EL element according to the present invention viewed in a thickness direction of the substrate, that is, a diagram viewed from the opening side of a concave portion. Although it depends on conditions to be formed, the inclined surface of the bank and the creep-up portion of the hole injection layer that creeps up the inclined surface are mainly formed largely at the periphery of the curved portions at both ends of the pixel region, and may be hardly formed at straight portions.

The organic EL element 52 of the present embodiment is formed in such a manner and it has a substantially elliptical shape in which a boundary region viewed from the thickness direction of the substrate has two straight portions that are substantially linear and face substantially parallel to each other, and leakage current block layers 5B are formed at curved portions 12B except two straight portions from the boundary regions. In other words, only at the curved portions of both ends of the pixel region 11B having a substantially oval shape (elliptical shape), the boundary regions (the inclined surface of the bank) 12B are formed. The creep-up portion of the hole injection layer (not shown) is also formed only at the boundary regions 12B. The leakage current block layers 5B of the present embodiment are formed only at the curved portions of both ends of the pixel region 11B so as to cover the creep-up portion of the hole injection layer formed at the curved portions.

In the organic EL element 52 having such a structure, since the leakage current block layers 5B are formed only at the required portions, it is possible to obtain an effect same as in the first embodiment as well as to reduce its cost through reducing the amount of the organic material for forming the leakage current block layer 5B.

Third Embodiment

Figure 4:
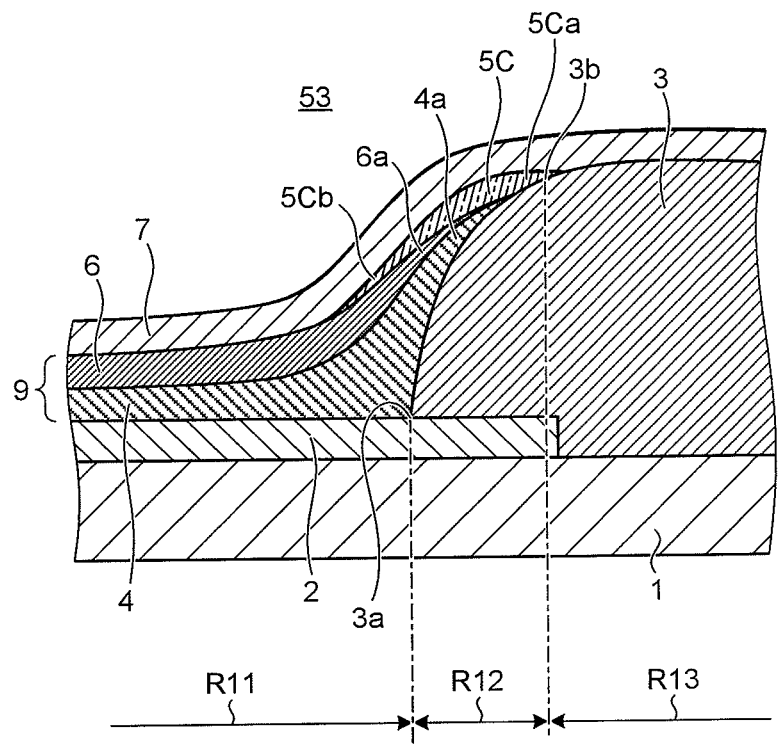
FIG. 4 is a sectional view of a portion of a pixel region of the third embodiment of the organic EL element according to the present invention.

FIG. 4 is the sectional view of the portion of the pixel region of the third embodiment of the organic EL element according to the present invention. According to the first embodiment, the leakage current block layer 5 is formed between the hole injection layer 4 and the light-emitting layer 6. The leakage current block layer 5C in the organic EL element 53 of the present embodiment is formed in a space surrounded by the light-emitting layer 6 and the bank 3, and the upper electrode 7. That is, in this present embodiment, the leakage current block layer 5C is formed after the light-emitting layer 6 has been formed.

The leakage current block layer 5C is formed by the ink-jet method same as in the first embodiment. By using a material having a proper viscosity to form the leakage current block layer 5C, it is repelled by the light-emitting layer 6, creeping up the inclined surface of the light-emitting layer 6 formed in the periphery of the pixel region R11. As the result, the leakage current block layer 5C is formed at a proper region including at least a region between the light-emitting layer 6 and the upper electrode 7 at the boundary region 12.

The leakage current block layer 5C formed in this way covers the creep-up portion 4a of the hole injection layer 4 and the creep-up portion 6a of the light-emitting layer 6 at the boundary region 12, and the creep-up portion 5Ca of itself is formed further upwardly at the boundary region 12. The lower end 5Cb of the leakage current block layer 5C is extended to a position where the leakage current block layer 5C covers the outer periphery of the pixel region R11. In the organic EL element 53 having such a structure, it is possible to obtain an effect same as in the first embodiment as well as to suppress current leaking through the light-emitting layer 6.

EXAMPLES

An actual organic EL element and a step of producing the organic EL element will be explained in detail. The present invention is not limited by the following examples.

Example 1

The present example corresponds to the first embodiment. The leakage current block layer is formed at at the periphery of a pixel over the entire circumference.
(Pretreatment for Substrate)

A substrate, in which ITO electrode pattern was formed on a glass substrate and a photoresist (M302R; manufactured by Sumitomo Chemical Co., Ltd.) was patterned thereon to form a bank, was used. The size of the bank was 170micrometers× 50 micrometers, and the pitch of pixels was 237 micrometers. After washing the substrate, the substrate was subjected to the surface-treatment by the reactive ion etching system (RIE-200L; manufactured by SAMCO, Inc.). The conditions for the surface-treatment is: oxygen ($O_2$) plasma treatment was carried out under the pressure of 5 pascals, the output of 30 watts, the $O_2$ flow rate of 40 standard cubic centimeter per minutes, and the time of 10 minutes; subsequently, carbon tetrafluoride ($CF_4$) plasma treatment was carried out under the pressure of 5 pascals, the output of 5 watts, the $CF_4$ flow rate of 7 standard cubic centimeter per minutes; and the time of 5 minutes.

(Formation of Hole Injection Layer)

PEDOT (CH8000LVW185; manufactured by H. C. Starck GmbH) was mixed with 2 weight percent of 2-butoxyethanol and then the mixture was filtered through a 0.45 micrometer filter, and the resultant was used for a hole injection layer. Ink-jet coating was performed by using the 80L (manufactured by Liter Corporation). At this time, droplets were applied at even intervals, and the number of the droplets per pixel were four droplets. After this application, the vacuum drying was performed. The hole injection layer made of PEDOT had the resistivity of $1\times10^5$ ohm centimeters to $3\times10^5$ ohm centimeters.

(Formation of Leakage Current Block Layer at Periphery of Pixel)

Ink-jet coating was performed using ink in which a heat/photo curable insulating polymer 1 was dissolved in an organic solvent and by using the 120L (manufactured by Litrex Corporation). As ink additives, dipentaerythritol hexaacrylate (DPHA) (manufactured by Nippon Kayaku Co., Ltd.), and Irgacure907 (manufactured by Ciba Speciality Chemicals Corporation) were blended in ratio by weight of insulating polymer 1:DPHA:Irgacure907=1:0.25:0.01, and the ink was prepared so that the insulating polymer 1 is 0.4 weight percent. At this time, the ink was filtered through an 1 micrometer filter to be the viscosity of 3 centi pores. When the ink is applied on the whole of the inside of the bank, about three to five droplets of the ink per pixel were applied at even intervals in the bank. After the application, the heat treatment was performed at about 200 degrees Celsius for 20 minutes under vacuum to cure the insulating polymer. The resistivity of the cured polymer film was $2\times10^{14}$ or more ohm centimeters.

(Pretreatment for Application of the Light-emitting Layer)

Because the liquid repelling effect of the bank is disappeared by the heat treatment, $CF_4$ plasma treatment was performed under the pressure of 5 pascals, the output of 5 watts, the $CF_4$ flow rate of 7 standard cubic centimeter per minutes, and the time of 1 minutes was performed. In addition, the UV-ozone ($O_3$) treatment was performed for 1 minute to reduce the water repellency of the cured insulating polymer 1.

(Formation of Light-emitting Layer)

As a solvent for the light-emitting layer ink, the organic solvent same as the solvent used for the insulating polymer 1 was used. As the polymer for the light-emitting layer, GP1302 (manufactured by Sumation Co. Ltd.) was used to be the ink concentration of 0.8 weight percent and the viscosity of 8 centi pores. At this time, the ink was filtered through the 1 micrometer filter to be used. Subsequently, ink-jet coating was performed by using 120L (manufactured by Litrex Corporation). Seven droplets are discharged per pixel. After the application, the heat treatment was performed in vacuum at about 100 degrees Celsius for 60 minutes.

(Vapor Deposition, Sealing)

After the heat treatment, the resultant coated substrate was moved on to the step of vapor deposition without exposing to air, the Ba film of 100 angstroms and the Al film of 200 angstroms were evaporated in the order to form the cathode on the light-emitting layer. Subsequently, glass sealing was performed.

According to the above method to manufacture the organic EL element, the organic EL element which can suppress the leakage current with good performance was obtained.

Example 2

The present example corresponds to the second embodiment, and is in the case where the leakage current block layer is formed only at the curved portions of the pixel.
(Formation of the Leakage Current Block Layer Only at Curved Portions of the Pixel)

An element was produced in the same manner as the Example 1 except that the ink of the insulating polymer 1 was not formed at the whole periphery of the pixel but was formed only at the curved portions of a pixel at the step of forming the leakage current block layer in the Example 1. In this case, one droplet was discharged only at each of the curved portions of the pixel (at two positions per pixel). The organic EL element of the second example can reduce the ink amount compared with that of the Example 1.

INDUSTRIAL APPLICABILITY

As mentioned in the above, an organic electroluminescence element and a method for producing the organic EL element according to the present invention are applied to an organic EL element used in a flat-panel display such as an active matrix display or a passive matrix display, and are useful.

The invention claimed is:

1. An organic electroluminescence element which is provided at a pixel region surrounded by a bank provided on the substrate, comprising:
a first electrode provided near to a substrate;
a second electrode provided at the side of the first electrode opposite to the substrate, and paired with the first electrode;
an organic layer held between the first electrode and the second electrode, and comprising at least one light-emitting layer;
a leakage current block layer formed between the first electrode and the second electrode and at a boundary region between the organic layer and the bank,
wherein an electric resistance of the leakage current block layer in a thickness direction of the substrate is higher than an electric resistance of the organic layer lying between the leakage current block layer and the first electrode in the thickness direction of the substrate.

2. The organic electroluminescence element according to claim 1, wherein the leakage current block layer is formed by an ink jet method.

3. The organic electroluminescence element according to claim 1, wherein the boundary region viewed from the thickness direction of the substrate has a substantially elliptical shape which has two straight portions that are substantially linear and face substantially parallel to each other, and the leakage current block layer is formed at curved portions which is at except the two straight portions from the boundary region.

4. The organic electroluminescence element according to claim 1, wherein the organic layer has a hole injection layer;
the hole injection layer is formed by an ink jet method configured to form a creep-up portion along an inclined surface of the bank;
and the leakage current block layer is provided between the creep-up portion of the hole injection layer and the second electrode.

5. The organic electroluminescence element according to claim 1, wherein the light-emitting layer is formed by an ink jet method configured to form a creep-up portion along an inclined surface of the bank,
and the leakage current block layer is provided between the creep-up portion of the light-emitting layer and the second electrode.

6. The organic electroluminescence element according to claim 1, wherein the width of the leakage current block layer in a direction from the bank to the center of the pixel region viewed from the thickness direction of the substrate is 1 micrometer or more to 10 micrometers or less.

7. The organic electroluminescence element according to claim 1, wherein the leakage current block layer has a resistivity of $10^6$ or more ohm centimeters.

8. The organic electroluminescence element according to claim 1, wherein the leakage current block layer is a polymer resin crosslinked with heat or light.

9. A method for producing an organic electroluminescence element, which has a first electrode provided near to a substrate, a second electrode provided at the side of the first electrode opposite to the substrate and paired with the first electrode, and an organic layer held between the first electrode and the second electrode and comprising at least one light-emitting layer, and which is at a pixel region surrounded by a bank provided on a substrate, the method comprising:
discharging an organic material in the pixel region by an ink jet method and forming a leakage current block layer between the first electrode and the second electrode, at a boundary region between the organic layer and the bank, so that electric resistance of the leakage current block layer in a thickness direction of the substrate is higher than an electric resistance of the organic layer sandwiched with the first electrode in the thickness direction of the substrate.

10. The method for producing an organic electroluminescence element according to claim 1, wherein at the forming the leakage current block layer, the leakage current block layer is stacked on a surface of a hole injection layer at the boundary region between the organic layer and the bank by making the organic material creep up along an inclined surface of the hole injection layer utilizing a property of the organic material that is repelled from the hole injection layer contained in the organic layer.

11. The method for producing an organic electroluminescence element according to claim 1, wherein at the forming the leakage current block layer, an edge of the leakage current block layer is formed on an inclined surface of the hole injection layer formed at an inner peripheral side surface of the pixel region, by dropping a droplet containing the organic material at the boundary region or the pixel region.

12. The method for producing an organic electroluminescence element according to claim 9, wherein at the forming the leakage current block layer, the leakage current block layer is formed on a surface of the light-emitting layer at the boundary region between the organic layer and the bank by making the organic material creep up along an inclined surface of the light-emitting layer utilizing a property of the organic material that is repelled from the light-emitting layer comprised in the organic layer.

13. The method for producing an organic electroluminescence element according to claim 9, wherein at the forming the leakage current block layer, an edge of the leakage current block layer is formed on an inclined surface of the light-emitting layer formed at an inner peripheral side surface of the pixel region, by dropping a droplet containing the organic material at the boundary region or the pixel region.

14. The method for producing an organic electroluminescence element according to claim 9, wherein the forming the leakage current block layer comprises discharging ink in which an organic solvent as the organic material is contained as a main component by the ink jet method, and thereafter crosslinking the ink by heat and/or light, thereby forming the leakage current block layer.

15. The method for producing an organic electroluminescence element according to claim 9, wherein the organic layer comprises the hole injection layer and the hole injection layer is formed by the ink jet method.

16. The method for producing an organic electroluminescence element according to claim 9, wherein the light-emitting layer is formed by the ink jet method.

* * * * *